United States Patent
Garg (10) Patent No.: US 10,180,994 B2
(45) Date of Patent: Jan. 15, 2019

(54) DYNAMIC MODEL ADAPTATION TO INTERFACE PROTOCOLS

(71) Applicant: Synopsys, Inc., Mountain View, CA (US)

(72) Inventor: Amit Garg, Haryana (IN)

(73) Assignee: Synopsys, Inc., Mountain View, CA (US)

( * ) Notice: Subject to any disclaimer, the term of this patent is extended or adjusted under 35 U.S.C. 154(b) by 883 days.

(21) Appl. No.: 13/912,117

(22) Filed: Jun. 6, 2013

(65) Prior Publication Data

US 2013/0332141 A1 Dec. 12, 2013

Related U.S. Application Data

(60) Provisional application No. 61/658,337, filed on Jun. 11, 2012.

(51) Int. Cl.
*G06F 17/50* (2006.01)

(52) U.S. Cl.
CPC ............................... *G06F 17/5009* (2013.01)

(58) Field of Classification Search
None
See application file for complete search history.

(56) References Cited

U.S. PATENT DOCUMENTS

| | | | |
|---|---|---|---|
| 7,512,732 B1 * | 3/2009 | Goossens | G06F 13/4027 710/315 |
| 8,693,466 B2 | 4/2014 | Johnson | |
| 2003/0061385 A1 | 3/2003 | Gonze | |
| 2006/0282233 A1 * | 12/2006 | Pasricha | G06F 17/5022 703/1 |
| 2007/0171898 A1 | 7/2007 | Salva | |
| 2012/0017197 A1 * | 1/2012 | Mehta | G06F 17/5022 717/104 |

OTHER PUBLICATIONS

Kogel, Tim, et al. "A modular simulation framework for architectural exploration of on-chip interconnection networks." Proceedings of the 1st IEEE/ACM/IFIP international conference on Hardware/software codesign and system synthesis. ACM, 2003.*

(Continued)

*Primary Examiner* — Omar F Fernandez Rivas
*Assistant Examiner* — Bijan Mapar
(74) *Attorney, Agent, or Firm* — Fenwick & West LLP (57) ABSTRACT

A system and a method are disclosed for simulating a target system. The target system may include a plurality of components coupled via a communication bus. Each component of the target system may include a model algorithm representing the internal behavior of the component, and a model interface configured to transfer and/or receive communication payloads to/from a peer component in the target system. During simulation initialization, a simulation model of a component of the target system is accessed and a protocol engine, associated with a bus communication protocol is selected to be attached to the simulation model of the accessed component. Then, during the simulation of the target system, the model interface receives an incoming payload and informs the protocol engine of the received payload. The protocol engine may instruct the model algorithm of the component to perform a protocol specific action based on the received payload.

23 Claims, 5 Drawing Sheets

(56) References Cited

OTHER PUBLICATIONS

Klingauf, Wolfgang, Robert Günzel, and Christian Schröder. "Embedded software development on top of transaction-level models." Hardware/Software Codesign and System Synthesis (CODES+ ISSS), 2007 5th IEEE/ACM/IFIP International Conference on. IEEE, 2007.*
"Requirements Specification for TLM 2.0" Version 1.1, Sep. 16, 2007, 32 pages.
"OSCI TLM-2.0 Language Reference Manual," Software Version: TLM 2.0.1, Document Version: JA32, Open SystemC Initiative (OSCI), Jul. 2009, 194 pages.
Alexander, D.S. et al., "Active Bridging," ACM SIGCOMM Computer Communication Review, 1997, pp. 101-111, vol. 27, No. 4.
Panda, P.R., "SystemC—A Modeling Platform Supporting Multiple Design Abstractions," The $14^{th}$ International Symposium on System Synthesis, IEEE, 2001, pp. 75-80.
Shin, D. et al., "Automatic Generation of Transaction Level Models for Rapid Design Space Exploration," Proceedings of the $4^{th}$ International Conference on Hardware/Software Codesign and System Synthesis, ACM, 2006, pp. 64-69.

* cited by examiner

DYNAMIC MODEL ADAPTATION TO INTERFACE PROTOCOLS

CROSS REFERENCE TO RELATED APPLICATIONS

This application claims the benefit of U.S. Provisional Application No. 61/658,337, filed Jun. 11, 2012, which is incorporated by reference in its entirety.

BACKGROUND

1. Field of Art

The disclosure generally relates to the field of system level modeling simulations.

2. Description of the Related Art

As computer systems have advanced, processing power and speed have increased substantially. At the same time, computer system complexity and the number of components included in a computer system have increased significantly. System design has correspondingly increased in complexity as more and more increasingly complex components are used in a given computer system.

In order to accelerate the development process, computer systems and their corresponding components can be simulated. A computer system may have several buses that allow the various components of the computer system to communicate. Those busses may use a variety of bus communication protocols. Often times, a user performing a simulation may need to test different bus communication protocols to determine which protocol to use in the actual system.

Creating simulation models for the components of a system that can understand the different bus communication protocols can be a time consuming process, and may add an extra layer of complexity to the simulation models. If a user wants to simulate the components of a system using different bus communication protocols, the user will need to create a new model for each of the components of the system that incorporates the specifics of the bus communication protocol the user wants to simulate.

Thus, a need exists for a solution to allow conversion of communication protocols.

SUMMARY

Embodiments relate to a system, method and computer readable storage medium that includes simulating different bus communication protocols in a target system by attaching different protocol engines, that are associated with each of the bus communication protocols to be simulated, to a TLM2.0 model. By doing this, the TLM2.0 model can be independent of bus communication protocol thus reducing the need of having different TLM2.0 models for each bus communication protocol.

In some embodiments, a simulation model of a component of a target system is accessed. The simulation model may include a model algorithm representing the internal behavior of the component, and a model interface configured to transfer communication payloads with a peer component of the target system. A protocol engine is selected based on a desired bus communication protocol from a protocol engine library.

During simulation of the target system, an incoming communication payload may be received by model interface of the simulation model of the component of the target system. The protocol engine may instruct the model algorithm to perform a protocol specific action based on the received incoming communication payload and the underlying bus communication protocol.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Computing Machine Architecture

Figure 1:
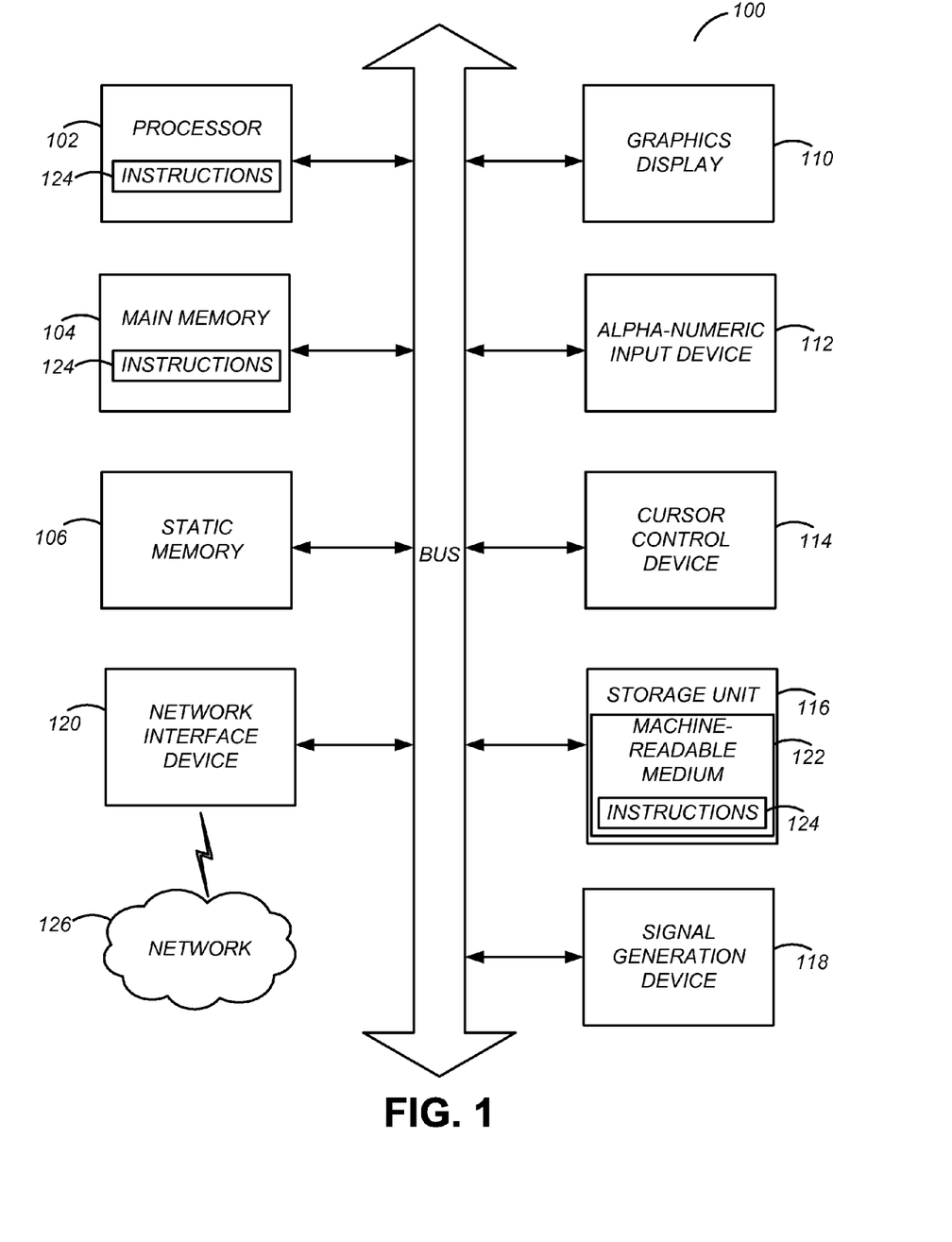
FIG. 1 illustrates the components of an example machine able to read instructions from a machine-readable medium and execute them in a processor (or controller), according to one embodiment.

FIG. 1 is a block diagram illustrating components of an example machine able to read instructions from a machine-readable medium and execute them in a processor (or controller). Specifically, FIG. 1 shows a diagrammatic representation of a machine in the example form of a computer system 100 within which instructions 124 (e.g., software) for causing the machine to perform any one or more of the methodologies discussed herein may be executed. In alternative embodiments, the machine operates as a standalone device or may be connected (e.g., networked) to other machines. In a networked deployment, the machine may operate in the capacity of a server machine or a client machine in a server-client network environment, or as a peer machine in a peer-to-peer (or distributed) network environment.

The machine may be a server computer, a client computer, a personal computer (PC), a tablet PC, a set-top box (STB), a personal digital assistant (PDA), a cellular telephone, a smartphone, a web appliance, a network router, switch or bridge, or any machine capable of executing instructions 124 (sequential or otherwise) that specify actions to be taken by that machine. Further, while only a single machine is illustrated, the term "machine" shall also be taken to include any collection of machines that individually or jointly execute instructions 124 to perform any one or more of the methodologies discussed herein.

The example computer system 100 includes a processor 102 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 104, and a static memory 106, which are configured to communicate with each other via a bus 108. The computer system 100 may further include graphics display unit 110 (e.g., a plasma display panel (PDP), a liquid crystal display (LCD), a projector, or a cathode ray tube (CRT)). The computer system 100 may also include alphanumeric input device 112 (e.g., a keyboard), a cursor control device 114 (e.g., a mouse, a trackball, a joystick, a motion sensor, or other pointing instrument), a storage unit 116, a signal generation device 118 (e.g., a speaker), and a network interface device 820, which also are configured to communicate via the bus 108.

The storage unit 116 includes a machine-readable medium 122 on which is stored instructions 124 (e.g., software) embodying any one or more of the methodologies or functions described herein. The instructions 124 (e.g., software) may also reside, completely or at least partially, within the main memory 104 or within the processor 102 (e.g., within a processor's cache memory) during execution thereof by the computer system 100, the main memory 104 and the processor 102 also constituting machine-readable media. The instructions 124 (e.g., software) may be transmitted or received over a network 126 via the network interface device 120.

While machine-readable medium 122 is shown in an example embodiment to be a single medium, the term "machine-readable medium" should be taken to include a single medium or multiple media (e.g., a centralized or distributed database, or associated caches and servers) able to store instructions (e.g., instructions 124). The term "machine-readable medium" shall also be taken to include any medium that is capable of storing instructions (e.g., instructions 124) for execution by the machine and that cause the machine to perform any one or more of the methodologies disclosed herein. The term "machine-readable medium" includes, but not be limited to, data repositories in the form of solid-state memories, optical media, and magnetic media.

Target System Simulation

Figure 2:
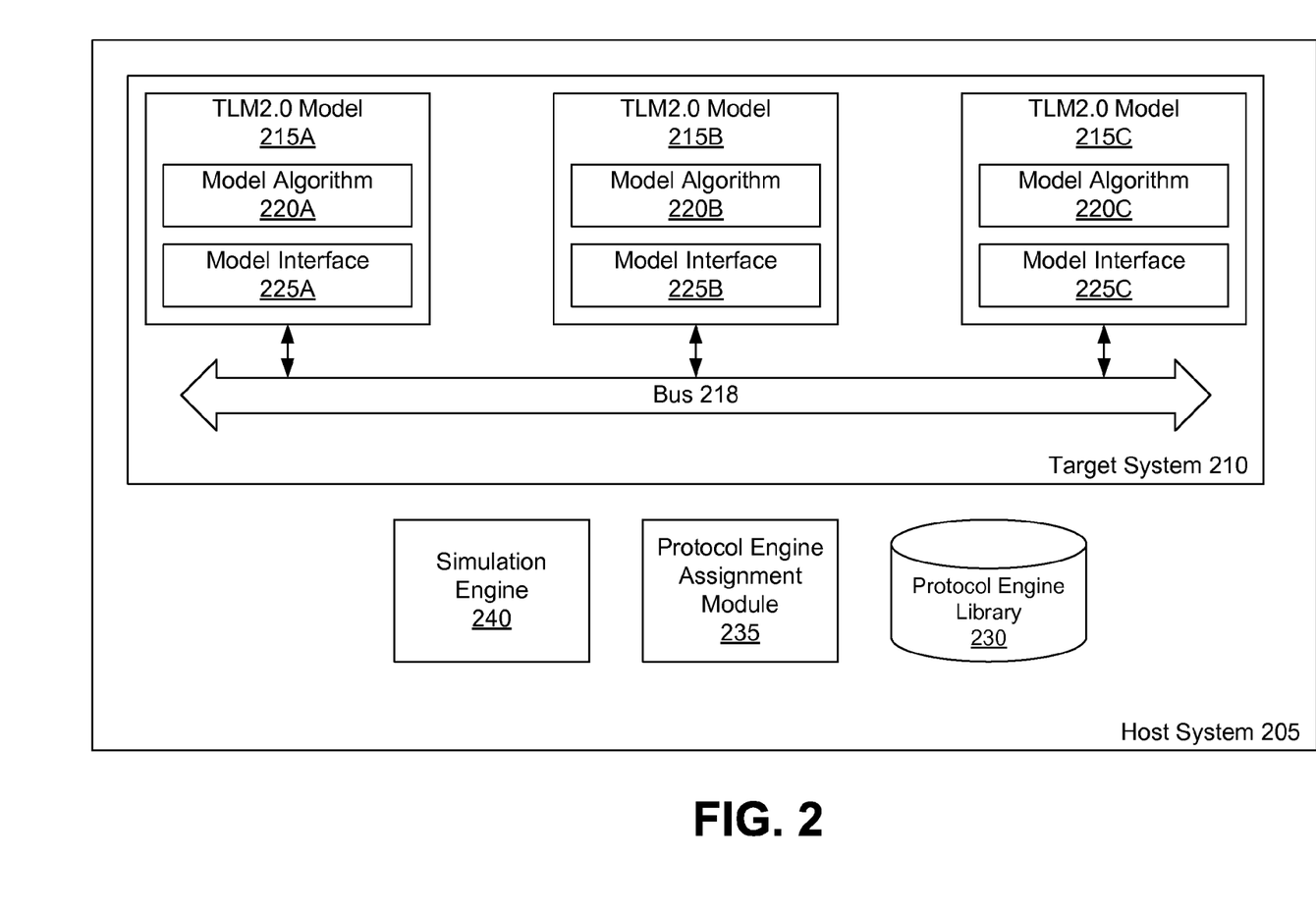
FIG. 2 illustrates a simulation environment for simulating a target system on a host system, according to one embodiment.

Referring now to FIG. 2, illustrated is a simulation environment for simulating a target system 210 on a host system 205, according to one embodiment. The target system 210 represents a computing device that is undergoing development and may be, for example, a system on chip (SoC). The target system 210 includes a plurality of transaction level modeling 2.0 (TLM2.0) compliant models 215. Each TLM2.0 model 215 models a component of the target system 210 that is coupled to and communicates via the bus 218. For example, a TLM2.0 model 215 may model a processor, memory, a network adapter, a storage unit, input/output (I/O) controllers, etc.

A TLM2.0 model 215 includes a model algorithm 220 and a model interface 225. The model interface 225 receives and/or transmits communications to and from other TLM2.0 models using TLM 2.0 semantics. The model algorithm 220 captures the behavior of the component the TLM2.0 model 215 is simulating. For example, if the TLM2.0 model 215 is an arithmetic logic unit (ALU), the model algorithm 220 may capture the algorithms the ALU uses to execute the different arithmetic operations it is capable of performing. Further, if the TLM2.0 model 215 is a memory unit, the model algorithm may capture the algorithms it uses to allocate blocks of memory after a request is received.

In one embodiment, the TLM2.0 model also includes a state object (not shown) that stores the current state of the TLM2.0 model 215. The state object may store information of the model that is needed for the functionality and processing of the data that the model will receive. In one embodiment, the state object is a state machine that is updated every time the model algorithm 220 performs an action. For example, the state object may be updated to reflect a successful allocation of a buffer by storing the address of the buffer into the state object.

In one embodiment, the TLM 2.0 models are simulated with SYSTEMC. SYSTEMC is a system-level modeling language that is approved by the Institute of Electrical and Electronics Engineers (IEEE) Standards Association as IEEE 1666. SYSTEMC allows describing a system at different levels of abstraction. More specifically, SYSTEMC is a language built in standard C++ by extending the language with the use of class libraries. SYSTEMC addresses the need for a system design and verification language that spans hardware and software. The language is particularly suited for modeling a system's partitioning, for evaluating and verifying the assignment of blocks to either hardware or software implementations, and for architecting and measuring the interactions between and among functional blocks. Throughout the specification, SYSTEMC will be used as an example of a system-level modeling language, but the principles described herein are applicable to any system-level modeling language.

The applications programming interface (API) (e.g., IEEE 1666 TLM2.0) for modeling with SYSTEMC at the transaction level has been standardized and is referred to as TLM2.0 (Transaction Level Modeling 2.0). TLM2.0 APIs of SYSTEMC provide a generic approach to defining the protocols or the models for the actual protocols. The API can thus be used to setup a protocol for components to communicate. However models of components may come from different places, be designed for different protocols, or different abstractions of the same protocol in more or less detail.

The simulation of the target system 210 runs on a host system 205, which can be, for example the computer system 100 from FIG. 1. The host system includes a protocol engine library 230, a protocol assignment module 235, and a simulation engine 240.

The protocol engine library 230 stores a plurality of protocol engines that can be used during the simulation of a target system 210. Each protocol engine is adapted for a specific bus communications protocol of the bus 218, such as the advanced extensible interface (AXI), the advanced high-performance bus (AHB), the advance peripheral bus (APB), etc. For example, the protocol engine library 230 may store a protocol engine specific for the AXI protocol, a protocol engine specific for the AHB protocol, etc. In one embodiment, the protocol engines stored in the protocol engine library 230 are prepackaged and a user simulating a target system 210 only needs to specify which protocol to use for a particular simulation. In other embodiments, the protocol engine is also defined by the user simulating the target system 210.

A protocol engine includes logic for configuring a non-protocol specific TLM 2.0 Model 215 for communication using a specific bus communications protocol. In more detail, a protocol engine is configured to interpret payloads, instruct a model algorithm 220 to perform a protocol specific action, and generate a return payload based on an action performed by a model algorithm 220. In some embodiments, timing points, state transitions and information availability that are bus communication protocol specific are also encapsulated in a protocol engine. The protocol engine may, for example, control when the model algorithm 220 receives any data that was sent through the bus 218 or when and how data that is being sent from the model algorithm 220 is transmitted via the bus 218.

In some embodiments, the protocol engine may update and/or generate a return payload to allow for updating of the state object of a peer TLM2.0 model 215B communication with the TLM2.0 model 215A. Furthermore, the protocol engine may add additional information into an incoming and/or return payload, based on the bus communication protocol it is associated with, to influence the downstream behavior of the data flow through the TLM2.0 model 215.

In some embodiments, the protocol engine is configured to control and/or influence the communication semantics based on the bus communication protocol, and the data and information availability for processing by the model algorithm 220. In one embodiment, the protocol engine is also configured to control and/or influence the TLM2.0 model 215 state object by controlling the date sampling and/or forwarding flows.

In some embodiments, the protocol engine is further configured to modify the TLM2.0 Model 215 state object. By doing this, the protocol engine may influence the behavior of the model algorithm 220 related to data processing of information coming from or going to the model interface 225.

As described herein, a payload is a packet of data used for communication between two or more TLM2.0 models 215. A payload may include one or more attributes. Payload attributes are elements carrying information in the payload (e.g., address, control information, data, etc.). A plurality or collection of attributes used by a specific protocol defines the complete protocol payload. Each payload attribute may be specified as an atomic element and can be either protocol agnostic (e.g., a generic attribute such as address, data, etc.) or an attribute specific to a particular protocol. For example, an attribute specific to a particular protocol can be a burstSize attribute specifying the size of each data beats or a burstLen attribute specifying the number of data beats in a given transaction.

The protocol engine assignment module 235 selects a protocol engine from the protocol engine library 230 and assigns it to a TLM2.0 model 215. In one embodiment, the protocol engine selection is based on a configuration file created by a user. The assignment of the protocol engine is performed before starting a simulation, during the simulation initialization stage.

The simulation engine 240 is configured to control the simulation of the target system 210. For example, the simulation engine 240 may be configured to control the flow of the simulation and the scheduling of the execution of each component of the target system 210. In some embodiments, the simulation engine 240 controls the simulation clock, used to synchronize the execution of each component of the target system 210. In one embodiment, the simulation engine also provides the semantics and framework for the TLM2.0 models 215 to operate with each other.

To explore the advantages of using different bus protocols in a particular target system 210, a user may want to simulate the different TLM2.0 models 215 of the target system communication using different bus communication protocols. For instance, a user may want to compare the performance of the target system when the TLM2.0 models 215 are communicating with each other using the AXI protocol and the AHB protocol. To achieve this, instead of creating two or more different TLM2.0 models 215, one for each protocol to be simulated, for each of the components of the target system, the user can create one protocol independent TLM2.0 model 215 for each component of the target system 210. The TLM2.0 models may use a generic TLM 2.0 compliant model interface 225 that is configured to receive any type of communication in any bus communication protocol and a model algorithm 215 that captures the behavior of the model independently of any bus communication protocol. In order to simulate different bus communication protocols, the protocol independent TLM2.0 models may use a protocol engine specific to the protocol to be simulated. In one embodiment, protocol engines are independent of the model that is using it.

Figure 3:
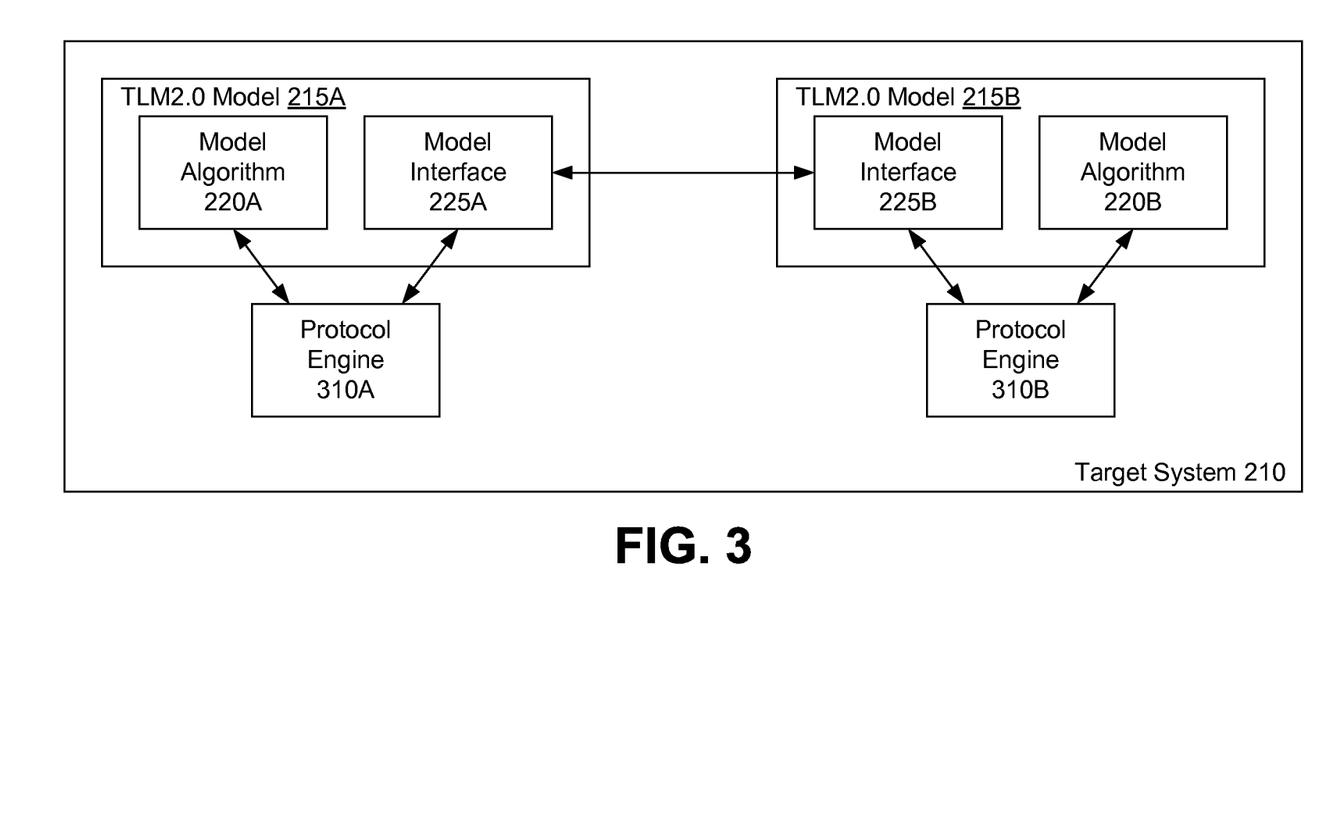
FIG. 3 illustrates a communication scheme between two models during the simulation of a target system, according to one embodiment.

Referring now to FIG. 3, illustrated is a box diagram of a communication scheme between two TLM2.0 models 215A and 215B, according to one embodiment. To simulate different bus communication protocols, each TLM2.0 model 215 may use a protocol engine. The protocol engine can receive communication payloads from the model interface 220 and instruct the model algorithm 225 to perform certain actions based on the received communication payload. During the initialization of the simulation, TLM2.0 models 215 request the protocol engine assignment module 235 to provide an instance of the needed protocol engine 310. Then, during the execution of the simulation, the model interface 225 forwards incoming payloads to its instance of the protocol engine 310.

The protocol engine 310 used by a TLM2.0 model 215 is specific to the bus communication protocol being simulated. If a different bus communication protocol needs to be simulated, the protocol engine assignment module 235 selects the appropriate protocol engine 310 from the protocol engine library 230. The process of selecting a protocol engine before starting a simulation is described in conjunction with FIG. 4 and the process of executing protocol specific simulations is described in conjunction with FIG. 5.

In some embodiments, the protocol engine 310 may be configured to augment an outgoing payload with protocol specific attributes. Payloads may be augmented with attributes such as security attributes, response status attributes and the like. If a TLM2.0 model 215 that does not understand an augmented attribute is used in a simulation of a target system 210, the TLM2.0 model 215 that does not understand the augmented attributes may ignore those attributes and only use the standard attributes with the TLM2.0 standard APIs.

Embodiments of the protocol engine 310 may also be configured to instruct the model algorithm 220 to perform protocol specific actions. For example, after receiving a request to allocate memory, a protocol engine may instruct the model algorithm of a memory to allocate a buffer with a certain buffer size, where the size of the buffer varies depending on the protocol supported by the protocol engine.

Figure 4:
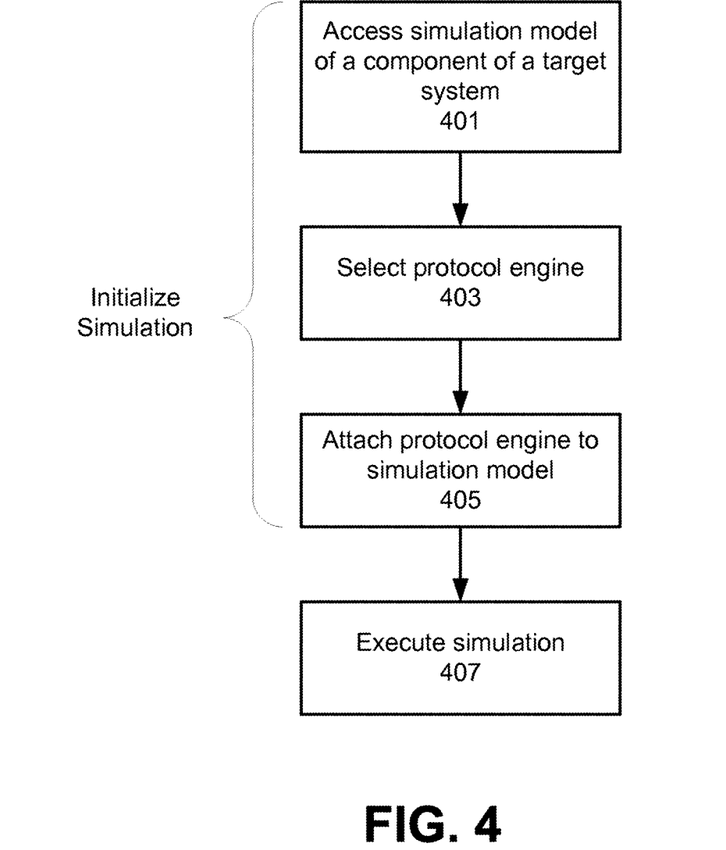
FIG. 4 illustrates a flow diagram of a process for simulating a target system, according to one embodiment.

FIG. 4 illustrates a flow diagram for simulating a target system 210 on a host system 205, according to one embodiment. During initialization of the simulation, a simulation model of a component of the target system is accessed 401. A protocol engine 403 is selected from the protocol engine library 230 that is appropriate for the bus communication protocol to be tested during the simulation. The selection may be made, for example, in response to a user input that identifies a particular bus communication protocol that is to be used for communications across the communication bus 218. The selected protocol engine is then attached 405 to the simulation model by the protocol engine assignment module 235.

The simulation of the target system is then executed 407 by the simulation engine 240. A detailed description of the execution of the simulation of the target system 210 is described in conjunction with FIG. 5.

Figure 5:
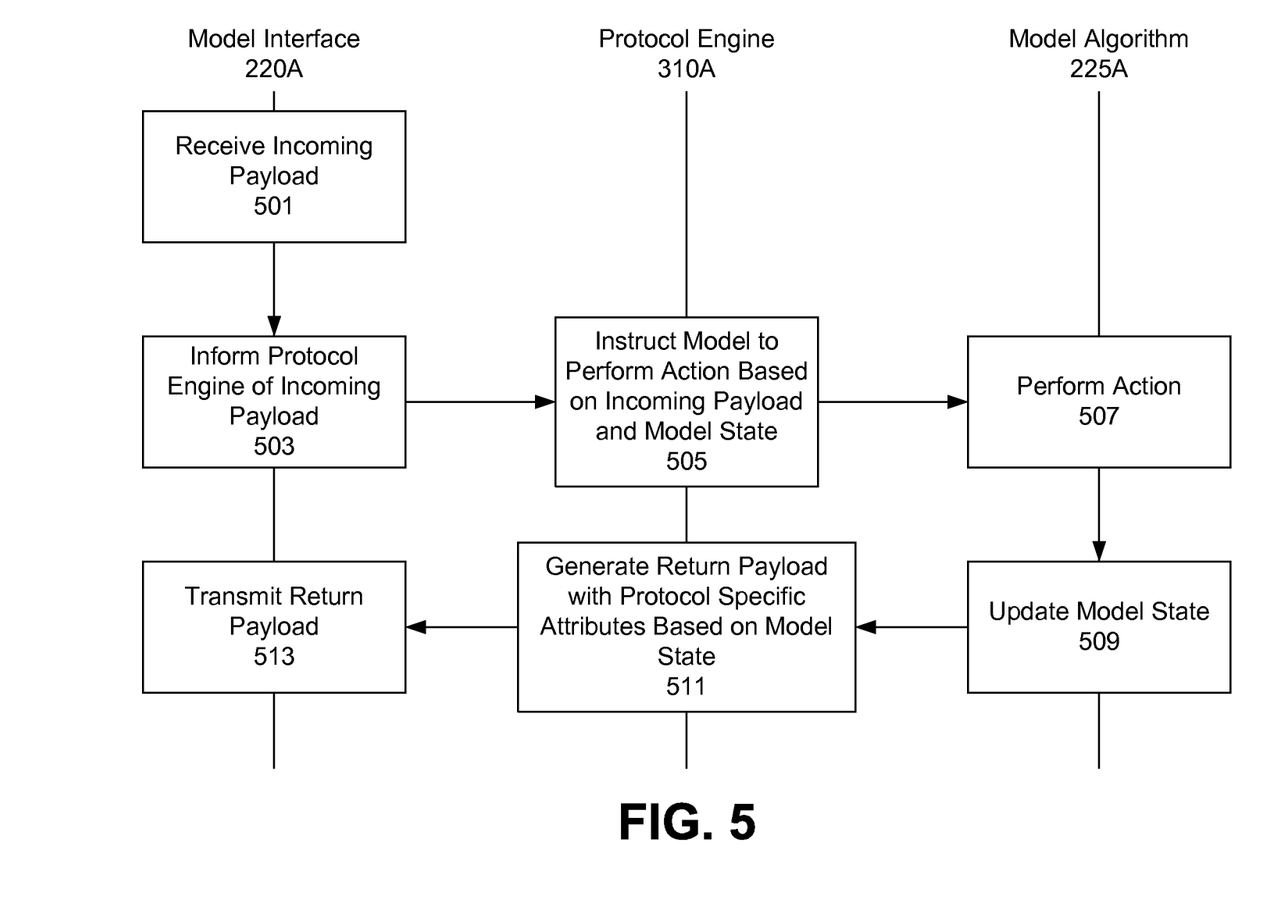
FIG. 5 illustrates a flow diagram of a process for simulating the handling of a payload, according to one embodiment.

FIG. 5 illustrates a flow diagram of a process for receiving and sending communication by a TLM2.0 model 215A, according to one embodiment. The TLM2.0 Model 215A receives an incoming payload through the model interface 225A. The incoming payload is received from another TLM2.0 model 215B of the target system 210, for example, through a TLM 2.0 API. The payload may include one or more protocol specific attributes.

The model interface 220A informs 503 the protocol engine 310A of an incoming payload. In one embodiment, the model interface 220A may forward the payload to the protocol engine 310A. The protocol engine 310A accesses the payload, analyzes the incoming payload and if needed, instructs 505 the model algorithm 225A to perform a protocol specific action based on the incoming payload and the model state.

The action that is performed will vary depending on the protocol of the protocol engine 310A, the attributes of the incoming payload, and the model state. For example, a TLM2.0 model 215A may receive an incoming payload from another TLM2.0 model 215B. The payload may be for a request to transmit data from the TLM2.0 model 215B to the TLM2.0 model 215B. If the target system 210 is using the AXI bus communication protocol, after receiving the incoming payload, the protocol engine 310A may instruct the model algorithm 220A to allocate a buffer with a size equal to the size of the data specified in the incoming payload. If, instead of using the AXI bus communication protocol, the target system 210 is using the AHB bus communication protocol, instead of instructing the model algorithm 220A to allocate a buffer with a size equal to the size of the data specified in the incoming payload, the protocol engine 310A may instruct the model algorithm 220A to allocate a buffer with a size of 1. In another example, in the AXI bus communication protocol, the model state stores a count of how many accesses are pending. Based on this count, the protocol engine may decide whether to accept or deny a new incoming request.

The model algorithm 220A performs 507 the action instructed by the protocol engine 310A and updates 509 the model state. In some embodiments, the model algorithm 225A further informs the protocol engine of the outcome 310A of the action performed. In one embodiment, the model algorithm 225A informs the protocol engine of the outcome 310A of the action performed by updating the TLM2.0 model 215. For example, the model algorithm 225A may inform the protocol engine 310A of a success or failure of the buffer allocation that was instructed by the protocol engine 310A.

The protocol engine 310A then generates 511 a return payload with protocol specific attributes based on the updated model state and the model interface 220A transmits 513 the return payload to the TLM2.0 model 210B. For example, for the AXI bus communication protocol, the protocol engine 310A may generate a return payload with an acknowledgment for every incoming payload received. For the AHB bus communication protocol, the protocol engine 310A may only generate a return payload with an acknowledgement after the entire data being transferred from TLM2.0 model 220B to TLM2.0 model 220A has been received. Additional protocol specific attributes may, for example, include a "retry" attribute. The "retry" attribute is present in the AHB bus communication protocol, but is not part of the AXI bus communication protocol. The "retry" attribute may, for example, signal a peer TLM2.0 model to resend a request payload. Another example of a protocol specific attribute is the "exclusive OK" (EX_OK), which is attribute present in the AXI bus communication protocol but not in the AHB bus communication protocol.

In some embodiments, the return payload, generated by the protocol engine 310A includes non-protocol specific (i.e. generic protocol agnostic) attributes, as well as protocol specific attributes. If the peer TLM2.0 model 215B receiving the return payload does not understand the protocol specific attributes, the peer TLM2.0 model 215B can still read the non-protocol specific attributes of the return payload using the standard TLM2.0 APIs. In some embodiments, the protocol specific attributes of the return payload are configured to modify the state object of the peer TLM2.0 model 215B based on the implementation of the bus communication protocol associated with the protocol engine 310 being used during the simulation of the target system 210

Additional Configuration Considerations

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for simulating different bus communication protocols used by a target system through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A computer-implemented method for simulating a target system, the method comprising:
  accessing a first simulation model of a first component of the target system, the first simulation model including a portion representing an internal behavior of the first component, the first simulation model also including a model interface configured to transfer communication payloads with a second simulation model of a second component of the target system;
  selecting a protocol engine that is adapted for a bus communication protocol and is independent of the first simulation model, the protocol engine configured to perform protocol specific actions corresponding to the bus communication protocol, and wherein the protocol engine is not specific to the first simulation model, the protocol engine selected from a protocol engine library comprising a plurality of protocol engines adapted for different bus communication protocols, wherein the protocol specific actions include augmenting an outgoing payload with protocol specific attributes; and executing a simulation of the target system by:
  receiving, by the model interface of the first simulation model, an incoming communication payload,
  informing, by the model interface of the first simulation model, the protocol engine that is independent of the first simulation model of the incoming communication payload received by the model interface of the first simulation model, and
  instructing, by the protocol engine that is independent of the first simulation model and responsive to being informed of the incoming communication payload, the portion of the first simulation model representing an internal behavior of the first component to perform an action in accordance with the bus communication protocol based on the incoming communication payload.

2. The method of claim 1, wherein the model interface is configured to transfer the communication payloads with the second simulation model of the second component of the target system via a standardized transaction level modeling (TLM) application programming interface (API), and wherein the incoming communication payload is received at the model interface of the first simulation model via the standardized TLM API.

3. The method of claim 1, further comprising:
  accessing, by the protocol engine, a state of the first simulation model,
  wherein the portion of the first simulation model representing the internal behavior is instructed, by the protocol engine, to perform the action based on the state of the first simulation model.

4. The method of claim 3, wherein the action comprises allocating a buffer in accordance with the bus communication protocol.

5. The method of claim 1, further comprising:
  generating, by the protocol engine, a return payload in accordance with the bus communication protocol; and
  transmitting, by the model interface of the first simulation model, the return payload to the second simulation model of the second component of the target system.

6. The method of claim 5, wherein the return payload is generated to include one or more protocol specific attributes that are specific to the bus communication protocol.

7. The method of claim 6, wherein the protocol specific attributes are included in the return payload as extensions to a standard payload.

8. The method of claim 1, wherein the protocol engine is configured to perform protocol specific actions corresponding to one of an advanced extensible interface (AXI) protocol or an advanced high-performance bus (AHB) protocol.

9. The method of claim 1, wherein the target system is a system on chip (SoC) and the first simulation model is a simulation model of a component of the (SoC).

10. The method of claim 1, wherein the incoming communication payload comprises at least one of data being transferred from the second simulation model of the second component to the first simulation model of the first component or an address for data transfer.

11. A non-transitory computer readable medium configured to store instructions for simulating a target system, the instructions when executed by a processor cause the processor to:
  access a first simulation model of a first component of the target system, the first simulation model including a portion representing an internal behavior of the first component, the first simulation model also including a model interface configured to transfer communication payloads with a second simulation model of a second component of the target system;
  select a protocol engine that is adapted for a bus communication protocol and is independent of the first simulation model, the protocol engine configured to perform protocol specific actions corresponding to the bus communication protocol, and wherein the protocol engine is not specific to the first simulation model, the protocol engine selected from a protocol engine library comprising a plurality of protocol engines adapted for different bus communication protocols, wherein the protocol specific actions include augmenting an outgoing payload with protocol specific attributes; and
  execute a simulation of the target system by:
    receiving, by the model interface of the first simulation model, an incoming communication payload,
    informing, by the model interface of the first simulation model, the protocol engine that is independent of the first simulation model of the incoming communication payload received by the model interface of the first simulation model, and
    instructing, by the protocol engine that is independent of the first simulation model and responsive to being informed of the incoming communication payload, the portion of the first simulation model representing an internal behavior of the first component to perform an action in accordance with the bus communication protocol based on the incoming communication payload.

12. The computer readable medium of claim 11, wherein the model interface is configured to transfer the communication payloads with the second simulation model of the second component of the target system via a standardized transaction level modeling (TLM) application programming interface (API), and wherein the incoming communication payload is received at the model interface of the first simulation model via the standardized TLM API.

13. The computer readable medium of claim 11, further comprising instructions that cause the processor to
  access, by the protocol engine, a state of the first simulation model,
  wherein the portion of the first simulation model representing the internal behavior is instructed to perform the action based on the state of the first simulation model.

14. The computer readable medium of claim 13, wherein the action comprises allocating a buffer in accordance with the bus communication protocol.

15. The computer readable medium of claim 11, further comprising instructions that cause the processor to
  generate, by the protocol engine, a return payload in accordance with the bus communication protocol; and
  transmit, by the model interface of the first simulation model, the return payload to the second simulation model of the second component of the target system.

16. The computer readable medium of claim 15, wherein the return payload is generated to include one or more protocol specific attributes that are specific to the bus communication protocol.

17. The computer readable medium of claim 16, wherein the protocol specific attributes are included in the return payload as extensions to a standard payload.

18. The computer readable medium of claim 11, wherein the protocol engine is configured to perform protocol specific actions corresponding to one of an advanced extensible interface (AXI) protocol or an advanced high-performance bus (AHB) protocol.

19. The computer readable medium of claim 11, wherein the target system is a system on chip (SoC) and the first simulation model is a simulation model of a component of the (SoC).

20. The computer readable medium of claim 11, wherein the incoming communication payload comprises at least one of data being transferred from the second simulation model of the second component to the first simulation model of the first component or an address for data transfer.

21. The method of claim 1, wherein the first simulation model is non-protocol specific, and wherein the protocol engine includes logic for configuring the first simulation model for communicating using the bus communication protocol.

22. The method of claim 1, wherein the protocol engine controls communication semantics between the first simulation model and the second simulation model based on the bus communication protocol.

23. The method of claim 1, further comprising:
receiving a first instance of the protocol engine, wherein the first instance of the protocol engine is not specific to the first simulation model;
associating the first instance of the protocol engine with the first simulation model;
receiving a second instance of the protocol engine different than the first instance of the protocol engine, wherein the second instance of the protocol engine is not specific to the second simulation model; and
associating the second instance of the protocol engine with the second simulation model;
wherein informing, by the model interface of the first simulation model, the protocol engine of the incoming communication payload comprises informing the first instance of the protocol engine of the incoming communication payload, and
wherein instructing, by the protocol engine, the portion of the first simulation model representing an internal behavior of the first component to perform an action in accordance with the bus communication protocol comprises instructing, by the first instance of the protocol engine, the portion of the first simulation model representing an internal behavior of the first component to perform an action in accordance with the bus communication protocol.

* * * * *